(12) United States Patent
Ohnishi

(10) Patent No.: US 7,969,004 B2
(45) Date of Patent: Jun. 28, 2011

(54) SEMICONDUCTOR DEVICE, METHOD FOR MOUNTING SEMICONDUCTOR DEVICE, AND MOUNTING STRUCTURE OF SEMICONDUCTOR DEVICE

(75) Inventor: Yuya Ohnishi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 200 days.

(21) Appl. No.: 12/244,856

(22) Filed: Oct. 3, 2008

(65) Prior Publication Data

US 2009/0091030 A1    Apr. 9, 2009

(30) Foreign Application Priority Data

Oct. 5, 2007  (JP) ................................. 2007-262665

(51) Int. Cl.
*H01L 23/48* (2006.01)
(52) U.S. Cl. ................ 257/737; 257/738; 257/E23.021; 257/E23.069; 438/612; 438/613; 438/614
(58) Field of Classification Search .................. 257/737, 257/738, E34.021, E23.069; 228/180.22; 438/612–617
See application file for complete search history.

(56) References Cited

U.S. PATENT DOCUMENTS

| 6,333,554 | B1 | 12/2001 | Kitajima et al. |
| 6,344,690 | B1 | 2/2002 | Kitajima et al. |
| 6,786,385 | B1 | 9/2004 | Kitajima et al. |
| 7,271,497 | B2 * | 9/2007 | Joshi et al. ..................... 257/780 |
| 2001/0014523 | A1 | 8/2001 | Bessho |
| 2002/0081830 | A1 | 6/2002 | Bessho |
| 2002/0100972 | A1 | 8/2002 | Kitajima et al. |
| 2003/0127747 | A1 | 7/2003 | Kajiwara et al. |
| 2007/0075422 | A1 | 4/2007 | Fujii et al. |
| 2007/0152331 | A1 | 7/2007 | Kang et al. |

FOREIGN PATENT DOCUMENTS

| CN | 1430272 A | 7/2003 |
| JP | 54-159173 A | 12/1979 |
| JP | 1-238044 A | 9/1989 |
| JP | 3-50736 A | 3/1991 |
| JP | 5-144821 A | 6/1993 |
| JP | 9-36120 A | 2/1997 |
| JP | 9-92654 A | 4/1997 |
| JP | 9-153497 A | 6/1997 |
| JP | 2007-12953 A | 1/2007 |

* cited by examiner

*Primary Examiner* — Jasmine J Clark
(74) *Attorney, Agent, or Firm* — Nixon & Vanderhye P.C.

(57) ABSTRACT

In order to realize a semiconductor device which is easily mounted on a circuit board and which has high mounting reliability, a semiconductor device 1 of the present invention includes: a semiconductor substrate 2; and an Au bump 3 provided on an electrode 21. The Au bump 3 is provided with a projection 3a. Also, on a surface of the Au bump 3, a solder layer 32 is formed via a Ni layer 31. The projection 3a makes it possible to easily mount the semiconductor device 1 by applying a small weight. Further, even if the amount of solder 62 supplied on an electrode 61 on a circuit board 6 is reduced, it is possible to bond the semiconductor device with a sufficient amount of solder during mounting. Furthermore, because a Ni layer 31 prevents dissolution of the bump, it is possible to ensure high mounting reliability.

15 Claims, 12 Drawing Sheets

SEMICONDUCTOR DEVICE, METHOD FOR MOUNTING SEMICONDUCTOR DEVICE, AND MOUNTING STRUCTURE OF SEMICONDUCTOR DEVICE

This Nonprovisional application claims priority under U.S.C. §119(a) on Patent Application No. 262665/2007 flied in Japan on Oct. 5, 2007, the entire contents of which are hereby incorporated by reference.

FIELD OF THE INVENTION

The present invention relates to a semiconductor device provided with a metal bump for use in flip-chip bonding, a method for mounting the semiconductor device, and a mounting structure of the semiconductor device.

BACKGROUND OF THE INVENTION

Conventionally, a semiconductor substrate is electrically connected to a circuit board by means of wire bonding. The wire bonding requires to ensure, on the outside of a chip, a space to which an end of a wire is connected. This increases the size of a package. Further, the wire bonding requires a long connection distance between the semiconductor substrate and the circuit board, thereby increasing inductance. For this reason, with the wire-bonding, it is difficult to increase a processing speed of a semiconductor device.

In order to solve these problems, Japanese Unexamined Patent Application Publication, Tokukai, No. 2006-54311 (published on Feb. 23, 2006; hereinafter, referred to as "Patent Document 1") and Japanese Unexamined Patent Application Publication, Tokukaihei, No. 11-87391 (published on Mar. 30, 1999; hereinafter, referred to as "Patent Document 2") propose a flip-chip bonding method. The flip-chip bonding method is such a bonding method that (i) a bump for bonding a semiconductor device to a circuit substrate is formed on a functional surface of the semiconductor substrate, (ii) the functional surface is set so as to face a surface of the circuit substrate, and (iii) the bump is bonded to an electrode on the circuit substrate.

FIG. 12 is a view illustrating a semiconductor device 71 described in Patent Document 1. The semiconductor device 71 includes: a semiconductor substrate 72; an Au bump 73 formed on an electrode 721 of the semiconductor substrate 72 and on a surface protection film 722 of the semiconductor substrate 72; a diffusion-prevention film 74 made of TiW; and a bonding film (solder) 75 formed on the diffusion-prevention film 74. TiW, which is material of the diffusion-prevention film 74, has a low diffusion coefficient for Au, so as to prevent diffusion between the Au bump 73 and Sn, which is material of the bonding film 75. Thus, it is maintained that the bonding film 75 is made of Sn purely.

One example of the flip-chip bonding method which is widely used is Au-solder bonding. The Au-solder bonding is a method for bonding together an Au bump formed on a semiconductor substrate and solder supplied on an electrode on a circuit board. This method utilizes Au—Sn metal bonding. Therefore, this method has high mounting reliability and is available in manufacturing fine-pitch products.

Also, such an arrangement is proposed that an Au bump is provided with a projection for the purpose of facilitating the process of flip-chip bonding. FIG. 13 is a cross-section view illustrating a process in which a semiconductor device 81 is mounted on a circuit board 6. FIG. 13 (a) illustrates a state where the semiconductor device 81 is not mounted on the circuit board 6 yet, and FIG. 13 (b) illustrates a state where the semiconductor device 81 has been mounted on the circuit board 6. The semiconductor device 81 includes: a semiconductor substrate 82; and an Au bump 83 which is provided on an electrode 821 on the semiconductor substrate 82. The Au bump 83 is provided with a projection 83a. An electrode 61 on the circuit board 6 is provided with solder 62.

As illustrated in the mounting structure in FIG. 13 (b), the projection 83a is inserted into the solder 62. This makes it possible to mount the semiconductor device 81 by applying a small weight.

In the arrangement illustrated in FIG. 13, however, the solder 62 is supplied only on the electrode 61 on the circuit board 6. Therefore, this arrangement cannot supply a sufficient amount of solder. As a semiconductor device has a higher density structure and a higher processing speed, the semiconductor device is required to have finer pitch between electrodes for flip-chip bonding, the electrodes being provided on a semiconductor substrate and on a circuit substrate. Having finer pitch between electrodes decreases the amount of solder which can be supplied. Therefore, it is difficult to enhance the mounting reliability in the arrangement illustrated in FIG. 13.

On the other hand, Patent Document 2 proposes an arrangement where solder is supplied, in advance, on an Au bump only.

FIG. 14 is a view illustrating a semiconductor device 91 described in Patent Document 2. The semiconductor device 91 includes: a semiconductor substrate 92 provided with an electrode 921; and an Au bump 93 provided on the electrode 921. Further, the Au bump 93 is provided with a projection 93a having a nose-shape. Also, the Au bump 93 is provided with solder 94 covering the projection 93a. However, Patent Document 2 does not disclose an arrangement where solder is supplied on the circuit substrate side in Therefore, in the arrangement illustrated in FIG. 14 also, it is impossible to ensure a sufficient amount of solder used for mounting a semiconductor device on a circuit board. That is, it is difficult to enhance the mounting reliability in the arrangement illustrated in FIG. 14, as well as in the arrangement illustrated in FIG. 13.

As such, the conventional arrangements described above have such a problem that sufficient mounting reliability cannot be attained.

Specifically, in the semiconductor device 71 described in Patent Document 1, the bonding film 75 is formed only on the top surface of the Au bump 73. Therefore, this arrangement cannot ensure a sufficient amount of solder, thereby decreasing the mounting reliability.

In the semiconductor device 81 illustrated in FIG. 13, as described above, the solder 62 is supplied only on the electrode 61 on the circuit board 6. Therefore, this arrangement cannot supply a sufficient amount of solder. That is, it is difficult to enhance the mounting reliability. Further, in the state illustrated in FIG. 13 (b), there is a case where the solder 62 reaches the electrode 821. If a high-temperature storage test is carried out with such a state, the solder 62 comes in an interface between the Au bump 83 and the electrode 821. This forms an intermetallic compound of Au and Sn, thereby causing a breakage in an early stage.

In the arrangement described in Patent Document 2, the solder 94 is directly supplied on the Au bump 93. This increases the amount of Au which diffuses in the solder 94, thereby leading to dissolution of the bump. Because the projection 93a on the Au bump 93 is thin, the mounting reliability will be significantly decreased if the projection 93a on the Au bump 93 is dissolved. Further, in this case, the solder has already reached the Au bump 93. This further increases the possibility of a breakage caused by the solder which has reached the electrode.

Patent Document 2 does not disclose such an arrangement that solder is supplied also on an electrode on a circuit board for the purpose of mounting a semiconductor device on the circuit board. That is, because the solder is supplied only on the Au bump 93, it is impossible to mount the semiconductor device 91 on the circuit board with a sufficient amount of solder. For this reason, it is impossible to enhance the mounting reliability in the arrangement described in Patent Document 2.

In the semiconductor device 81 illustrated in FIG. 13, the following arrangement is possible: The size of the Au bump 83 is increased so that the Au bump 83 touches the surface protection film 822 and covers the electrode 821 completely. This arrangement prevents the solder 62 from coming in the interface between the Au bump 83 and the electrode 821. However, in this arrangement, bonding pressure generated in the process of forming the Au bump 83 can cause a crack on the surface protection film 822.

SUMMARY OF THE INVENTION

The present invention was made in view of the foregoing problems, and an object of the present invention is to realize a semiconductor device which is easily mounted on a circuit substrate and which has high mounting reliability.

In order to solve the foregoing problems, a semiconductor device according to the present invention includes: a semiconductor substrate; a metal bump provided on an electrode on the semiconductor substrate; and a solder layer formed on at least a part of a surface of the metal bump, the metal bump having a protruded portion which protrudes toward a surface of a circuit board on which surface the semiconductor device is to be mounted, and a metal layer being formed between the metal bump and the solder layer so as to protect the metal bump.

With this arrangement, the solder layer is formed on the metal bump in advance for the purpose of mounting the semiconductor device on the circuit board. Therefore, even in a case where the amount of solder supplied on the circuit board side is reduced, it is possible to bond the semiconductor device to the circuit board with a sufficient amount of solder. In addition, because the metal bump has the protruded portion, it is possible to easily mount the semiconductor device on the circuit board by applying a small weight. Also, it is possible to increase a bonding area in the solder layer and thereby to enhance the mounting reliability. Furthermore, the metal layer is formed between the metal bump and the solder layer so as to protect the metal bump. This prevents the solder from dissolving the bump. Thus, the present invention realizes a semiconductor device which can be mounted on a circuit board easily and which has high mounting reliability.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 1 (*a*) illustrates a state where the semiconductor device is not mounted on the circuit board yet, and FIG. 1 (*b*) illustrates a state where the semiconductor device has been mounted on the circuit board.

FIG. 8 (*a*) illustrates a state where the semiconductor device is not mounted on the circuit board yet, and FIG. 8 (*b*) illustrates a state where the semiconductor device has been mounted on the circuit board.

FIG. 13 (*a*) illustrates a state where the conventional semiconductor device is not mounted on the circuit board yet, and FIG. 13 (*b*) illustrates a state where the conventional semiconductor device has been mounted on the circuit board.

DESCRIPTION OF THE EMBODIMENTS

First Embodiment

The following describes one embodiment of the present invention with reference to FIG. 1 through FIG. 6.

Figure 2:
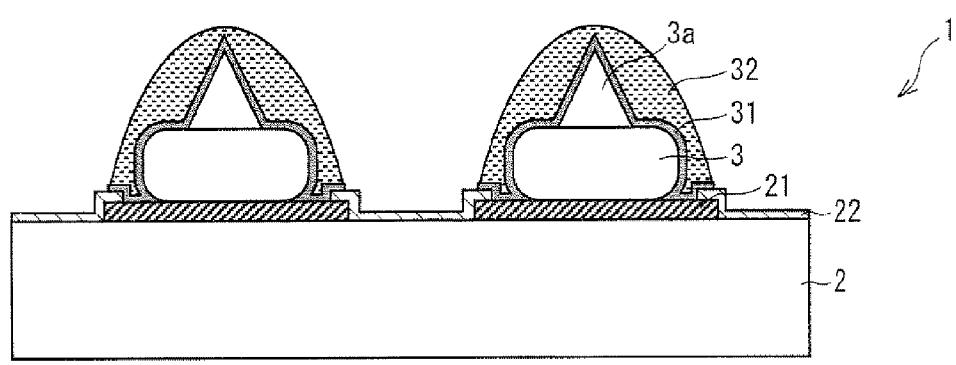
FIG. 2 is a cross-section view illustrating the semiconductor device.

FIG. 2 is a cross-section view illustrating a semiconductor device 1 according to the present embodiment. The semiconductor device 1 includes a semiconductor substrate 2 and an Au bump (metal bump) 3. The surface of the semiconductor substrate 2 is provided with an electrode 21 and a surface protection film 22. The Au bump 3 is provided on the electrode 21 and has a projection (protruded portion) 3*a* having a cone-shape. This allows the projection 3*a* to penetrate through a surface oxide layer of solder with a small weight during flip-chip bonding.

The Au bump 3 has a Ni layer 31 on its surface, and the Ni layer 31 has solder (solder layer) 32 thereon. The Ni layer 31 protects the Au bump 3 from dissolution. Also, the Ni layer 31 protects the projection 3*a* so that the projection 3*a* does not dissolve in the solder 32 during flip-chip bonding. This increases a connecting area between the Au bump 3 and the solder 32, thereby enhancing the mounting reliability. In addition, even if a crack occurs in the solder 32, it is possible to prevent further development of the crack.

In the semiconductor device 1, a part of the electrode 21 is not covered with the surface protection film 22 and exposed therethrough. That is, a part of the surface protection film 22 and the uncovered part of the electrode 21 are covered with the Ni layer 31. This prevents the solder from coming in an interface between the Au bump 3 and the electrode 21 during flip-chip bonding.

Next, the following describes a process in which the semiconductor device 1 is mounted by means of the flip-chip bonding method.

Figure 1:
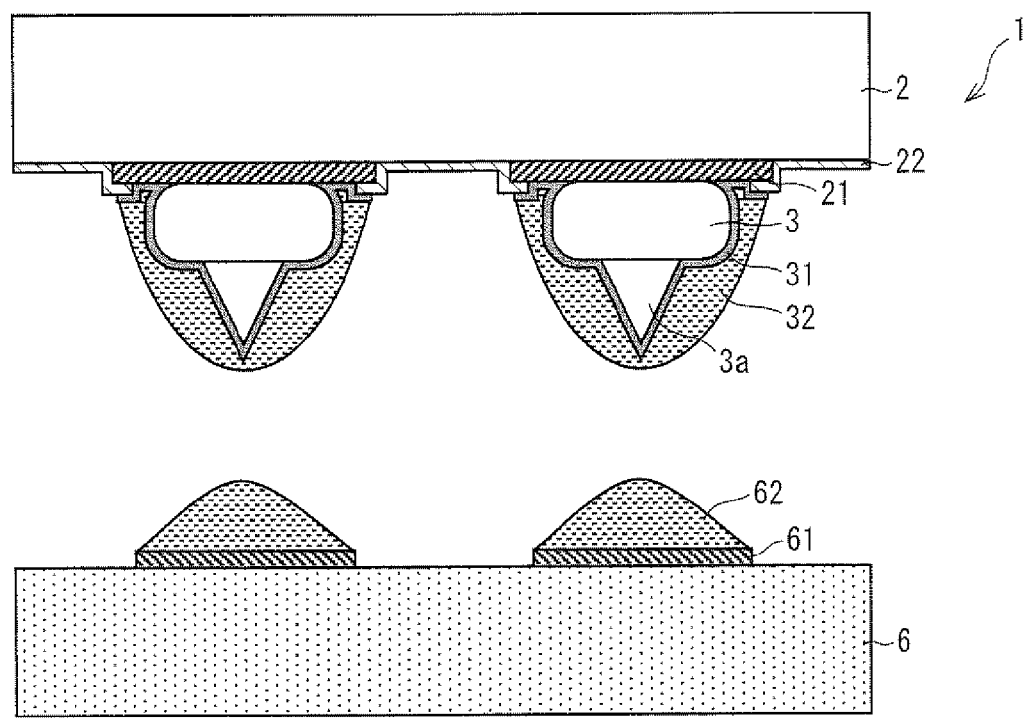
FIG. 1 is a cross-section view illustrating a process in which a semiconductor device according to one embodiment of the present invention is mounted on a circuit board.
Figure 1:
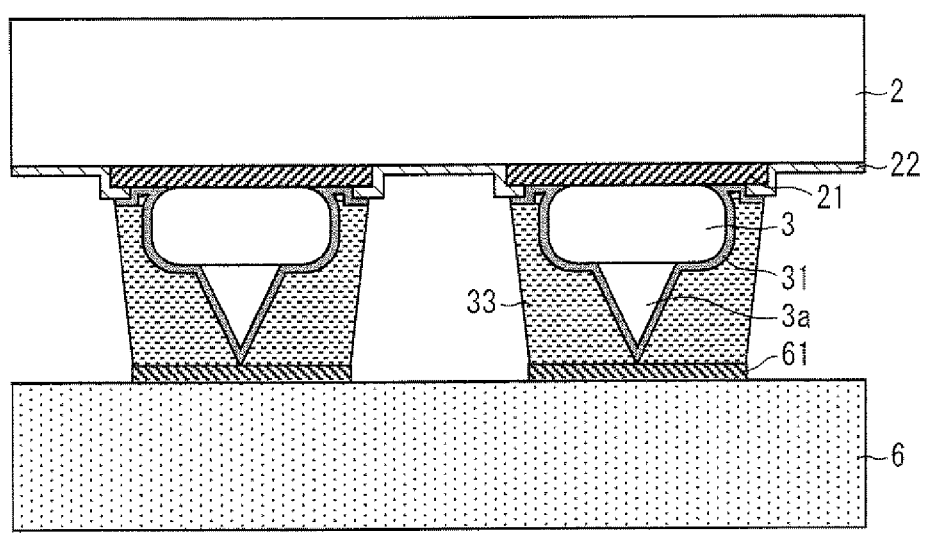
Figure 13:
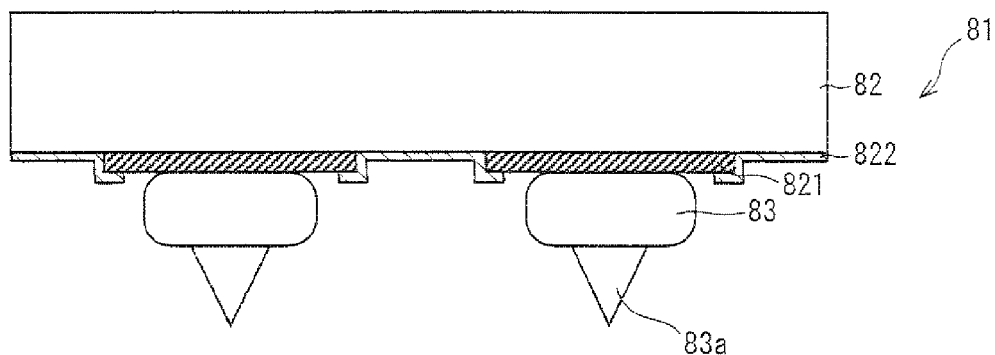
FIG. 13 is a cross-section view illustrating a process in which the conventional semiconductor device is mounted on a circuit board.
Figure 13:
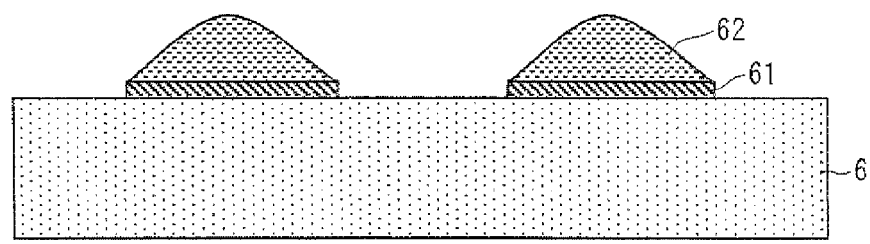
Figure 13:
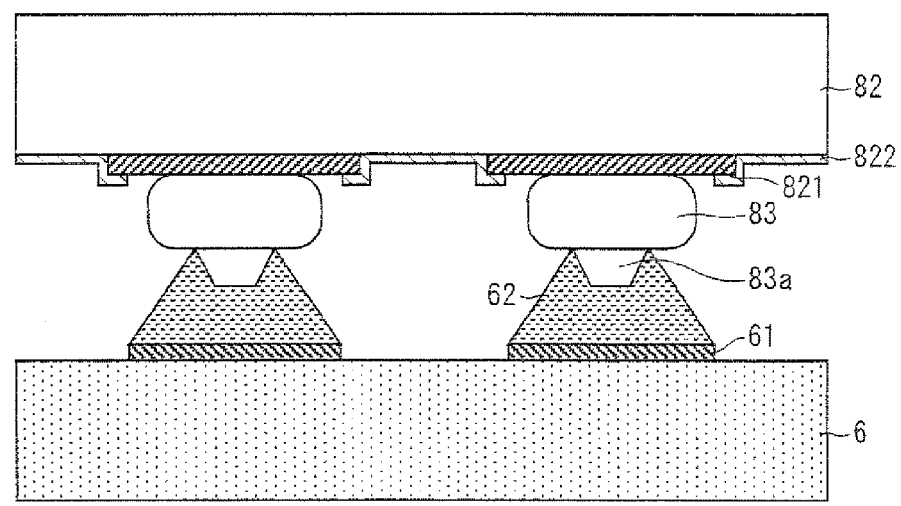
Figure 14:
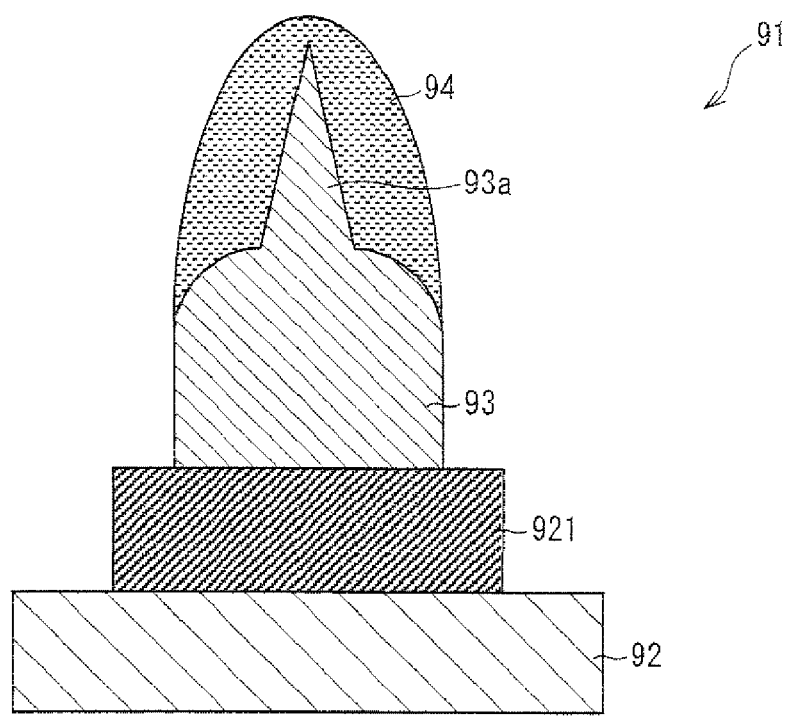
FIG. 14 is a cross-section view illustrating another conventional semiconductor device.

FIG. 1 is a cross-section view illustrating a process in which the semiconductor device 1 is mounted on a circuit board 6. FIG. 1 (a) illustrates a state where the semiconductor device 1 is not mounted on the circuit board 6 yet, and FIG. 1 (b) illustrates a state where the semiconductor device 1 has been mounted on the circuit board 6. In the flip-chip bonding method illustrated in FIG. 1, solder is supplied both on: the Au bump 3 on the semiconductor substrate 2; and the electrode 61 on the circuit board 6. As a result, compared with a conventional mounting structure as illustrated in FIG. 13 (b) in which solder is supplied only on an electrode on a circuit board, it is possible for the mounting structure illustrated in FIG. 1 (b) to ensure a larger amount of solder and thereby to reduce the amount of solder supplied on the electrode on the circuit board. That is, a short circuit does not easily occur between the electrodes when the solder 62 is supplied on the electrode 61 on the circuit board 6. This improves a yield rate even in a manufacturing process of fine-pitch substrates. Also, this process is pseudo solder-solder bonding. Therefore, it is not necessary to form an alloy layer during bonding, thereby making it possible to have a lower bonding temperature.

The solder 62 may be supplied on the electrode 61 on the circuit board 6 by means of (i) any one of all precoating methods such as: a Super Juffit (Registered Trademark) method; a solder paste method; a super solder method; and a solder-dam paste method or (ii) a plating method.

Figure 3:
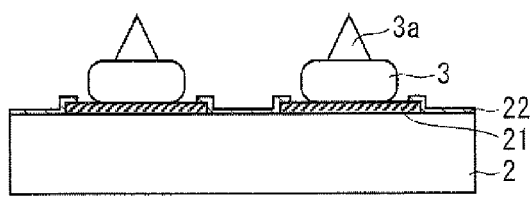
FIG. 3 is a cross-section view illustrating a process in which a Ni layer is formed on an Au bump in the semiconductor device.
Figure 3:
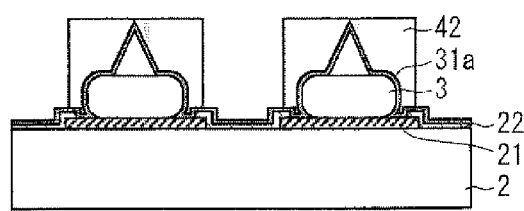
Figure 3:
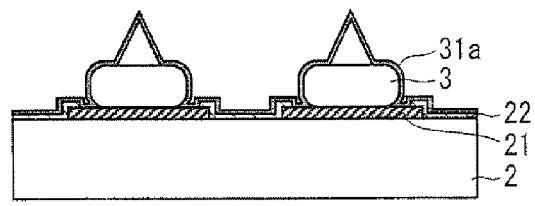
Figure 3:
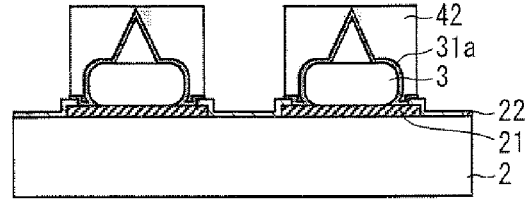
Figure 3:
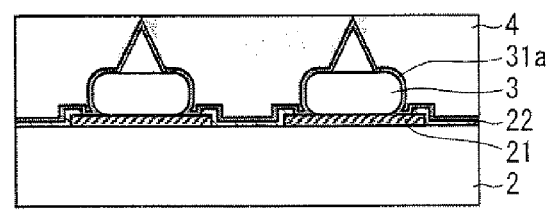
Figure 3:
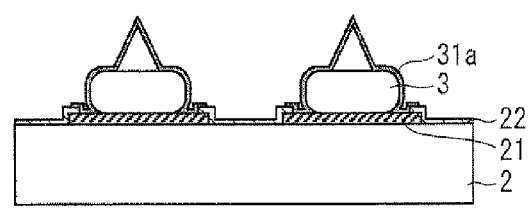
Figure 3:
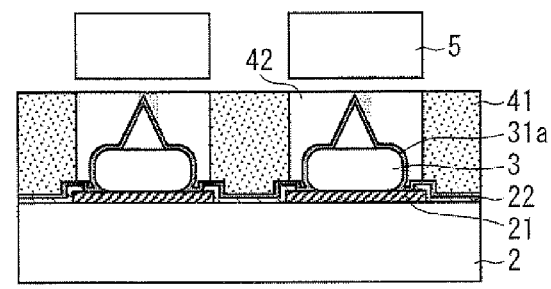
Figure 4:
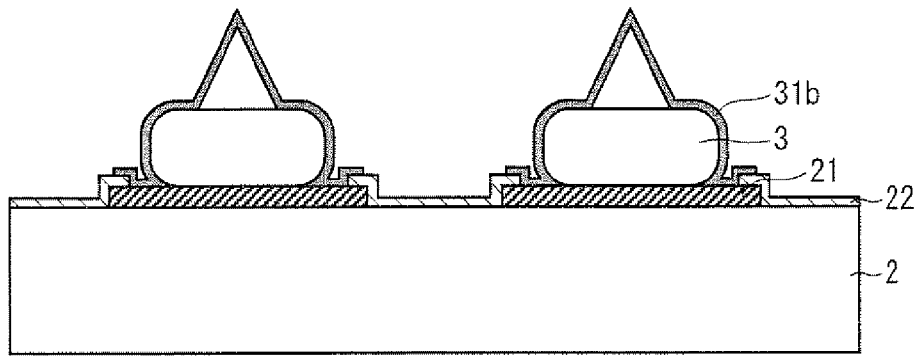
FIG. 4 is a cross-section view illustrating a process in which solder is supplied on the Au bump by means of a Super Juffit (Registered Trademark) method.
Figure 4:
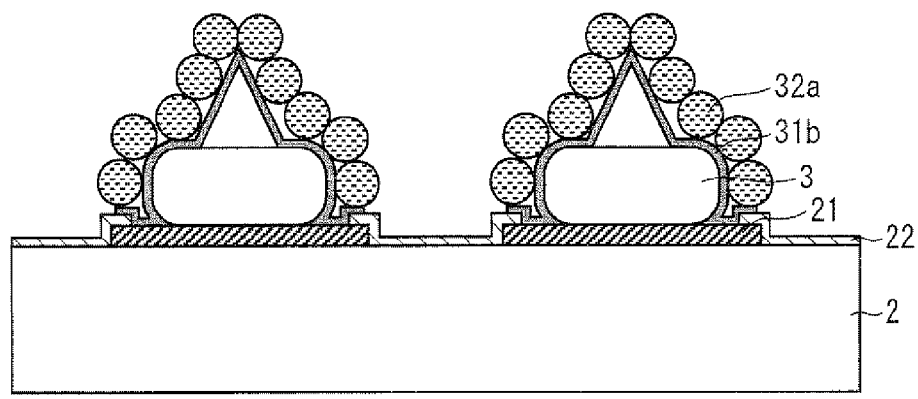
Figure 4:
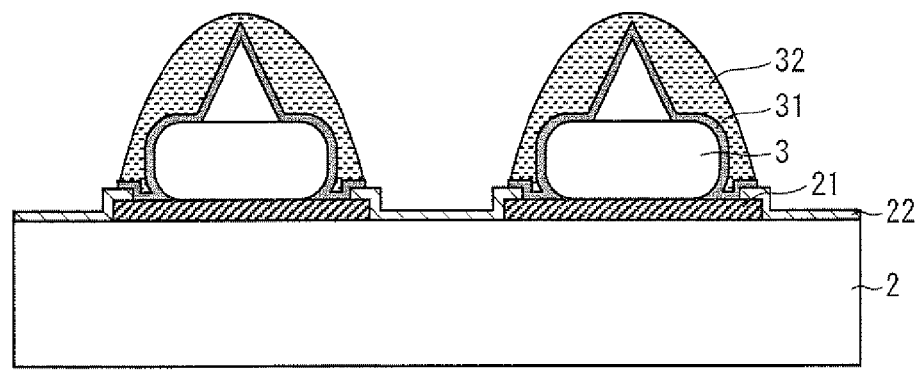

Next, the following describes, with reference to FIG. 3 and FIG. 4, a process in which a Ni layer is formed on an Au bump and a process in which solder is supplied on the Au bump.

FIG. 3 is a cross-section view illustrating a process in which a Ni layer 31 is formed on an Au bump 3. Firstly, the Au bump 3 is provided on an electrode 21 on a semiconductor substrate 2 (FIG. 3 (a)). Then, a Ni layer 31a is deposited, by means of a sputtering method, on the whole surface of the Au bump 3, on the whole surface of a surface protection film 22, and on an uncovered part of the electrode 21 (FIG. 3 (b)). Next, resist 4 is applied onto the whole surface of the Ni layer 31a (FIG. 3 (c)). Subsequently, resist 41 applied on a part of the Ni layer 31a is exposed to light by using a mask 5 (FIG. 3 (d)). Then, the resist 41 thus exposed to light is removed, so that resist 42 which is not exposed to light remains (FIG. 3 (e)). After that, the uncovered part of the Ni layer 31a is subjected to etching (FIG. 3 (f)). Lastly, the resist 42 which remains is removed (FIG. 3 (g)).

With this process, the Ni layer 31a is deposited on: the whole surface of the Au bump 3; the uncovered part of the electrode 21; and a part of the surface protection film 22. It is preferable that the Ni layer 31a is deposited so as to have a thickness of 20 nm or more for the purpose of more surely protecting the Au bump 3.

FIG. 4 is a cross-section view illustrating a process in which solder 32 is supplied on an Au bump 3 by means of the Super Juffit (Registered Trademark) method. The Ni layer 31a in the state illustrated in FIG. 3 (g) is treated by a chemical liquid, so as to form a Ni layer 31b which has adhesion on its surface (FIG. 4 (a)). After that, solder powder 32a is stuck to the Ni layer 31b (FIG. 4 (b)). Then, the solder powder 32a is molten and the solder powder 32a thus molten is leveled, so that the surface of the Ni layer 31 is precoated with the solder 32 (FIG. 4 (c)).

Note that the solder 32 may be supplied by means of a plating method, as well as by the Super Juffit (Registered Trademark) method. The following describes, with reference to FIG. 5, a process in which a Ni layer and solder are supplied on an Au bump by means of the plating method.

Figure 5:
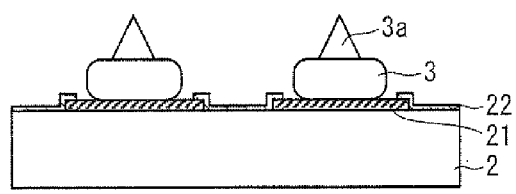
FIG. 5 is a cross-section view illustrating a process in which a Ni layer and solder are supplied on the Au bump by means of a plating method.
Figure 5:
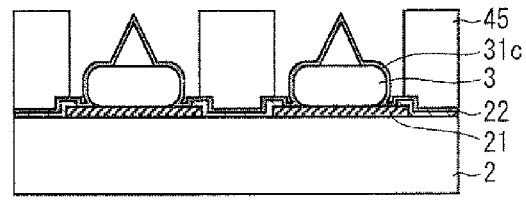
Figure 5:
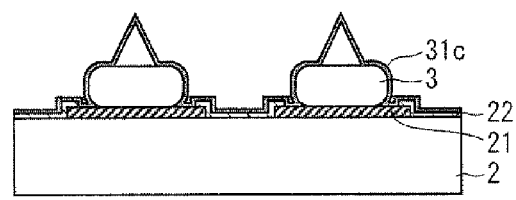
Figure 5:
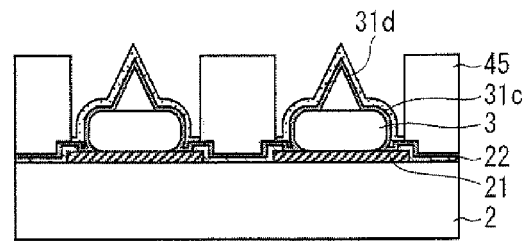
Figure 5:
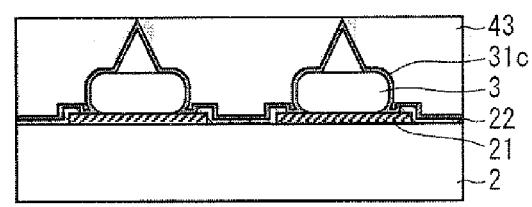
Figure 5:
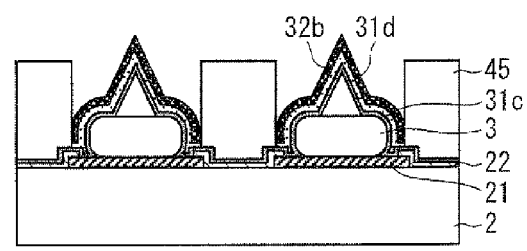
Figure 5:
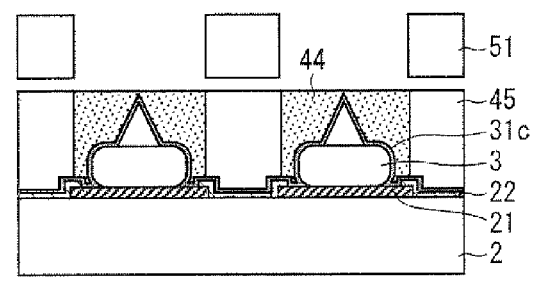
Figure 5:
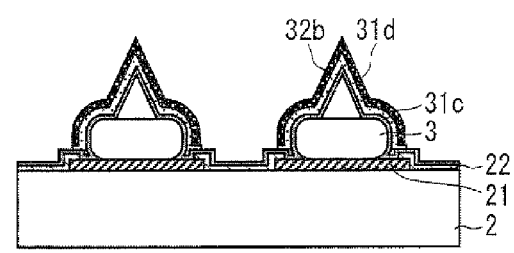

Firstly, in a state where an Au bump 3 is provided on an electrode 21 on a semiconductor substrate 2 (FIG. 5 (a)), a seed layer 31c made of Au or Ni is deposited on the whole surface of the semiconductor substrate 2 and on the whole surface of the Au bump 3 by means of the sputtering method so that electricity is supplied during a plating process (FIG. 5 (b)). Subsequently, resist 43 is applied on the seed layer 31c (FIG. 5 (c)). Then, resist 44 covering a part to which a Ni layer is to be deposited is exposed to light by using a mask 51 (FIG. 5 (d)). After that, the resist 44 thus exposed to light is removed, and resist 45 which is not exposed to light remains (FIG. 5 (e)). Subsequently, a Ni layer 31d is deposited thereon by means of the plating method (FIG. 5 (f)). Then, solder (solder layer) 32b is deposited thereon by means of the plating method (FIG. 5 (g)). After that, the resist 45 is removed, so as to attain such a state that the solder 32b covers the Ni layer 31d (FIG. 5 (h)).

Figure 6:
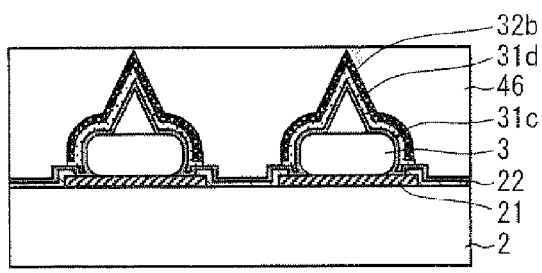
FIG. 6 is a cross-section view illustrating a process in which an uncovered part of a seed layer is removed.
Figure 6:
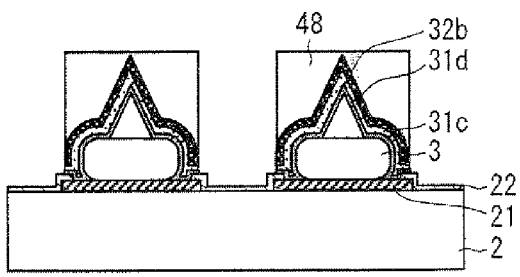
Figure 6:
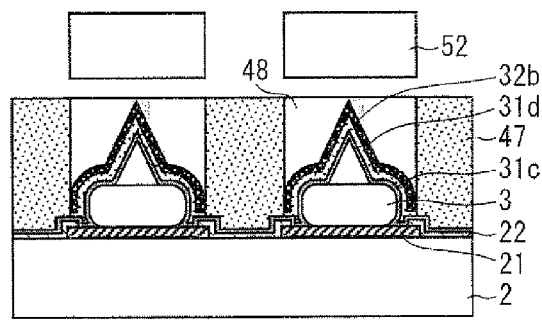
Figure 6:
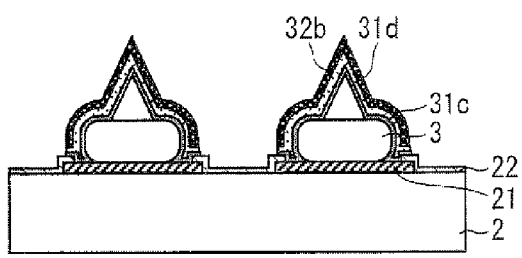
Figure 6:
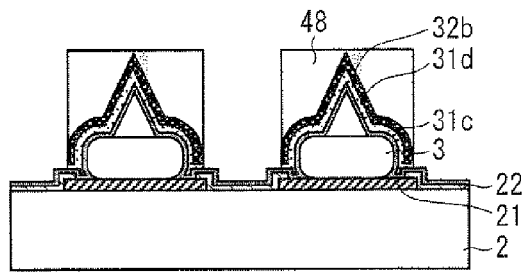

FIG. 6 illustrates a process in which an uncovered part of the seed layer 31.c is removed.

Firstly, new resist 46 is applied on the whole surface of the semiconductor substrate 2 and on the whole surface of the Au bump 3 (FIG. 6 (a)). Subsequently, resist 47, which covers the uncovered part of the seed layer 31c, is exposed to light by using a mask 52 (FIG. 6 (b)). Then, the resist 47 thus exposed to light is removed (FIG. 6 (c)). After that, the uncovered part of the seed layer 31c is removed (FIG. 6 (d)). Then, the resist 47 which remains is removed (FIG. 6 (e)).

As such, the plating method has more number of steps, thereby increasing cost and time. However, with the plating method, it is possible to form a thicker Ni layer than with the sputtering method. Further, although the Super Juffit (Registered Trademark) method causes such a problem that the amount of solder which can be supplied varies by the distance between electrodes, the plating method does not cause such a problem.

Described above is the Super Juffit (Registered Trademark) method and the plating method. However, the present invention is not limited to these, but may use all precoating methods such as a solder paste method, a super solder method, and a solder-dam paste method. For example, the amount of solder which can be supplied and paste supply accuracy in the super solder method are the same as these in the Super Juffit (Registered Trademark) method. However, the super solder method has more number of steps than the Super Juffit (Registered Trademark) method has. (Specifically, in the super solder method, the number of times that each of the following steps is carried out is increased by one: application of resist; exposure of resist; removal of exposed resist; and removal of remaining resist.) Thereby, the super solder method requires much cost. Also, the solder paste method has less amount of solder which can be supplied and a lower paste supply accuracy. Considering all the various factors together, the Supper Juffit method is the most suitable for attaining finer pitch.

Second Embodiment

Another embodiment of the present invention is described below with reference to FIG. 7 through FIG. 11.

Figure 7:
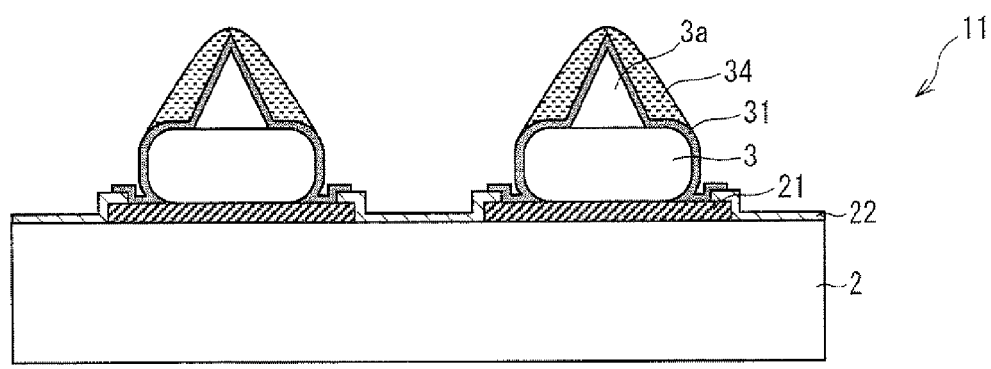
FIG. 7 is a cross-section view illustrating a semiconductor device according to another embodiment of the present invention.

FIG. 7 is a cross-section view illustrating an arrangement of a semiconductor device 11 according to the present embodiment. In the semiconductor device 1 illustrated in FIG. 1, the solder 32 is supplied on the whole surface of the Au bump 3. Instead of this arrangement of the semiconductor device 1, the semiconductor device 11 has such an arrangement that solder (solder layer) 34 is supplied only on a part of a Ni layer 31, the part covering: a projection 3a of an Au bump 3; and the top surface of the Au bump 3 having a pedestal-shape. Compared with the arrangement of the semiconductor device 1 illustrated in FIG. 1, this arrangement of the semiconductor device 11 ensures a less amount of solder. On the other hand, the arrangement of the semiconductor device 11 can reduce the possibility of a short circuit between bumps during supply of solder or during flip-chip bonding. For this reason, it is preferable that fine-pitch (50 μm or less) products use the semiconductor device 11 illustrated in FIG. 7.

Next, the following describes the process of flip-chip bonding carried out for the semiconductor device 11.

Figure 8:
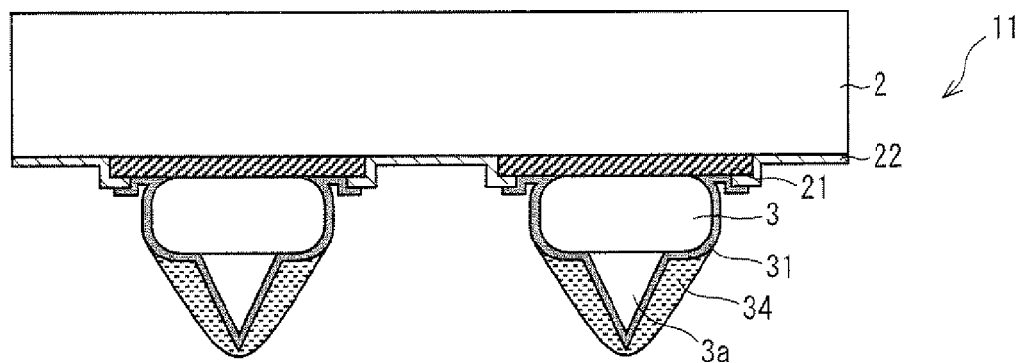
FIG. 8 is a cross-section view illustrating a process in which the semiconductor device illustrated in FIG. 7 is mounted on a circuit board.
Figure 8:
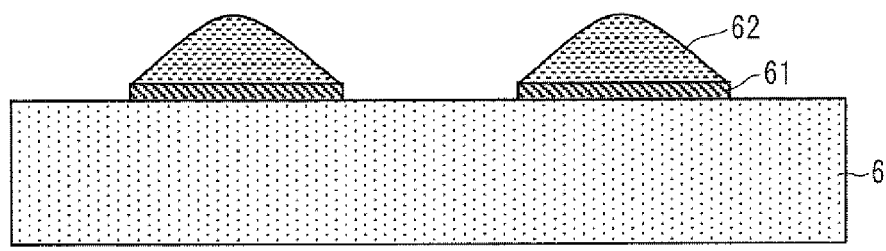
Figure 8:
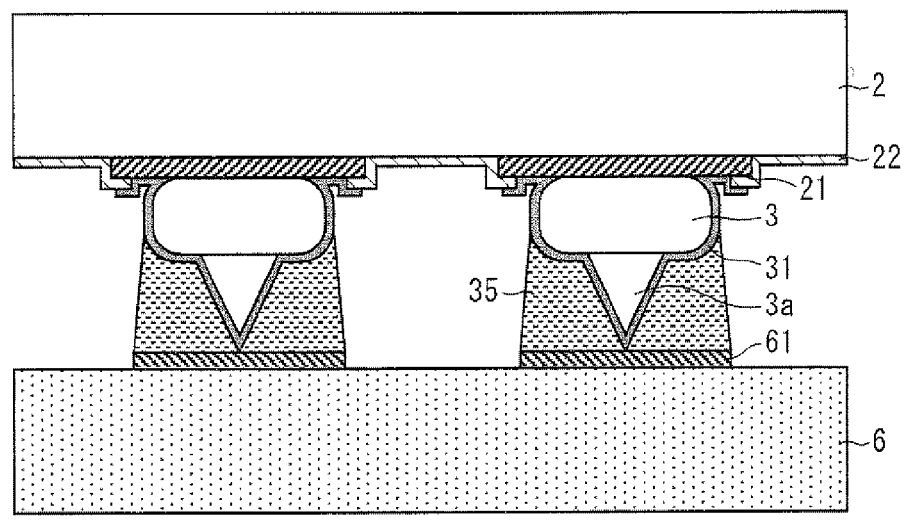

FIG. 8 is a cross-section view illustrating a process in which a semiconductor device 11 is mounted on a circuit board 6. FIG. 8 (a) illustrates a state where the semiconductor device 11 is not mounted on the circuit board 6 yet, and FIG. 8 (b) illustrates a state where the semiconductor device 11 has been mounted on the circuit board 6. As shown in the mounting structure illustrated in FIG. 8 (b), the amount of solder 35 spreading in the direction parallel to a semiconductor substrate 2 and the circuit board 6 is less than the amount of solder 33 spreading in this direction in the mounting structure illustrated in FIG. 1 (b). As a result, a short circuit between bumps does not easily occur during flip-chip bonding. Still, the Au bump 3 is surely covered with the solder 35. Therefore, this structure does not affect the mounting reliability.

The following describes a variation of the semiconductor device according to the present embodiment.

Figure 9:
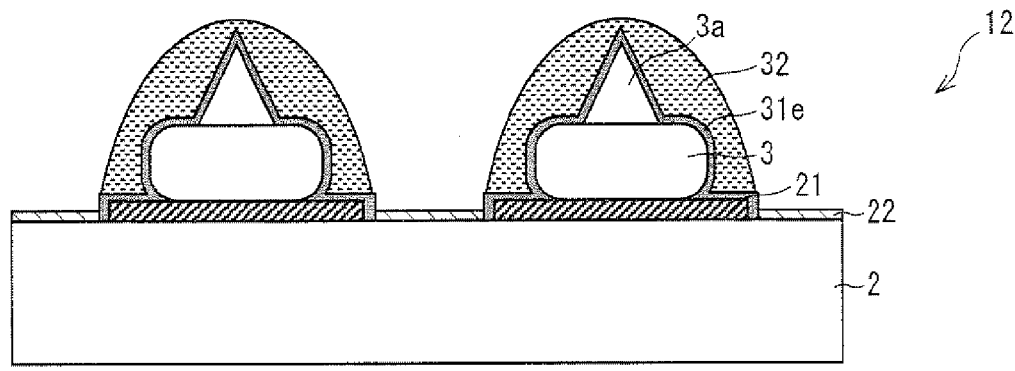
FIG. 9 is a cross-section view illustrating a variation of the semiconductor device according to another embodiment of the present invention.

FIG. 9 is a cross-section view illustrating an arrangement of a semiconductor device 12 according to the present embodiment. In the semiconductor device 12, a surface protection film 22 does not cover an electrode 21 on a semiconductor substrate 2. In light of this, the semiconductor device 12 adopts the following arrangement so as to prevent solder from coming in an interface between an Au bump 3 and the electrode 21: An Ni layer 31e is formed on the whole surface of the Au bump 3 and on an uncovered part of the electrode 21, and solder 32 is supplied on the whole surface of the Ni layer 31e.

Also, as well as in the semiconductor device 11 illustrated in FIG. 7, the amount of solder to be supplied may be reduced.

Figure 10:
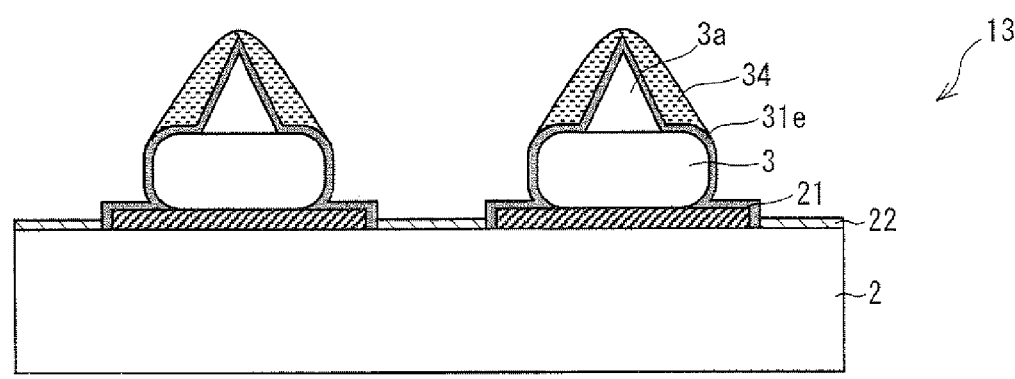
FIG. 10 is a cross-section view illustrating another variation of the semiconductor device according to another embodiment of the present invention.
Figure 11:
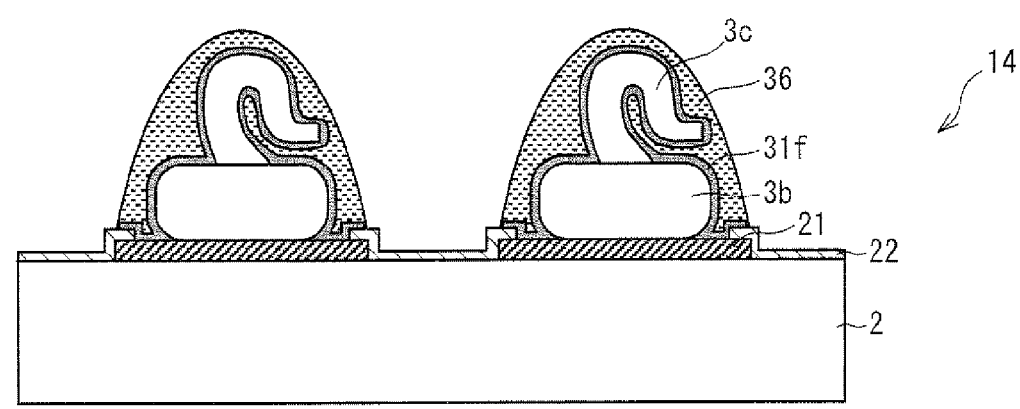
FIG. 11 is a cross-section view illustrating further another variation of the semiconductor device according to another embodiment of the present invention.
Figure 12:
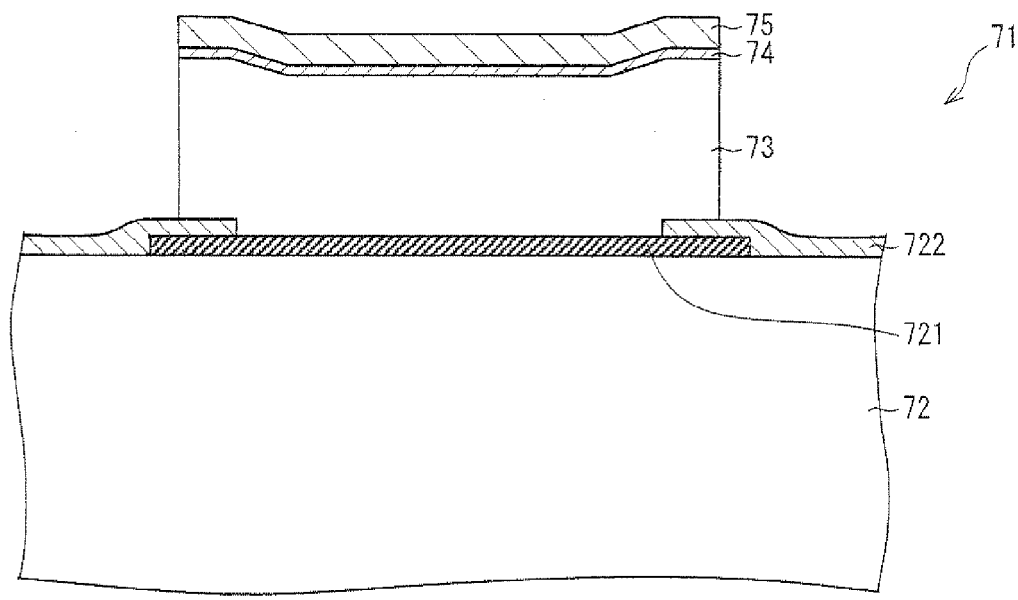
FIG. 12 is a cross-section view illustrating a conventional semiconductor device.

FIG. 10 is a cross-section view illustrating an arrangement of a semiconductor device 13 according to the present embodiment. In the semiconductor device 12 illustrated in FIG. 9, the solder 32 is supplied on the whole surface of the Au bump 3. Instead of this arrangement of the semiconductor device 12, the semiconductor device 13 has such an arrangement that solder 34 is supplied only on a part of a Ni layer 31e, the part covering, a projection 3a of an Au bump 3; and the top surface of the Au bump 3 having a pedestal-shape. In this arrangement of the semiconductor device 13 also, it is possible to bond a semiconductor device to a circuit board with a sufficient amount of solder during flip-chip bonding.

Described above is the arrangement where an Au bump has a projection. However, the present invention is not limited to this, but may have a protruded portion which does not have a shape of a projection. For example, as in a semiconductor device 14 illustrated in FIG. 11, an Au bump (metal bump) 3b may have a protruded portion 3c having a loop-shape. In this case also, with (i) a Ni layer 31f deposited on the whole surface of the Au bump 3b and (ii) solder (solder layer) 36 deposited thereon, it is possible to mount a semiconductor device on a circuit board with a small weight and to ensure sufficient mounting reliability.

Described above is the arrangement where a Ni layer is used as a metal layer for protecting an Au bump from dissolution. However, the present invention is not limited to this. The metal layer used in the present invention may be a metal layer made of a metal such as Bi, Cd, Ge, Zn, Cr, Ga, and TiW. In a case where solder is supplied to an Au bump by means of the Super Juffit (Registered Trademark) method, it is preferable to use a Ni layer. Also, a bump for bonding a semiconductor device may be a Cu bump, as well as an Au bump.

Summary of Embodiments

The present invention is not limited to the description of the embodiments above, but may be altered by a skilled person within the scope of the claims. An embodiment based on a proper combination of technical means disclosed in different embodiments is encompassed in the technical scope of the present invention.

As described above, a semiconductor device according to the present embodiment includes: a semiconductor substrate; a metal bump provided on an electrode on the semiconductor substrate; and a solder layer formed on at least a part of a surface of the metal bump, the metal bump having a protruded portion which protrudes toward a surface of a circuit board on which surface the semiconductor device is to be mounted, and a metal layer being formed between the metal bump and the solder layer so as to protect the metal bump. This realizes a semiconductor device which can be mounted on a circuit board easily and which has high mounting reliability.

In the semiconductor device according to the present embodiment, it is preferable that the metal layer covers at least the protruded portion.

Because the protruded portion is thin, the mounting reliability will be significantly decreased if the protruded portion is dissolved. In light of this, in this arrangement, the metal layer which prevents dissolution of a bump covers at least the protruded portion. This ensures high mounting reliability.

In the semiconductor device according to the present embodiment, it is preferable that when the electrode on which the metal bump is provided has an uncovered part, the metal layer is formed so as to cover the uncovered part of the electrode.

With this arrangement, because the metal layer covers the uncovered part of the electrode, it is possible to prevent a breakage caused by solder which comes in an interface between the metal bump and the electrode.

In the semiconductor device according to the present embodiment, the metal layer may further cover a part of a surface protection film on the semiconductor substrate.

In the semiconductor device according to the present embodiment, the metal layer may be a sputtered film or a plated film.

In the semiconductor device according to the present embodiment, it is preferable that the solder layer is formed so as to cover the protruded portion and a top surface of the metal bump, the top surface facing the circuit board.

With this arrangement, the solder layer is formed so as to cover the protruded portion, and the protruded portion protrudes toward the surface of the circuit board. Therefore, in a process in which the semiconductor device is mounted on the circuit board, it is possible to easily bond together the solder layer on the metal bump and the solder layer on the circuit board side. Also, this arrangement has a less amount of solder to be used, so as to reduce the possibility of a short circuit which occurs between the bumps while the solder layer is formed or the semiconductor device is mounted on the circuit board. For this reason, this arrangement is particularly suitable for fine-pitch products.

In the semiconductor device according to the present embodiment, it is preferable that the solder layer is formed so as to cover the whole surface of the metal layer.

With this arrangement, it is possible to ensure a sufficient amount of solder and thereby to further enhance the mounting reliability.

In the semiconductor device according to the present embodiment, it is preferable that the solder layer is formed by means of any one of all precoating methods including a Super Juffit (Registered Trademark) method, a solder paste method, a super solder method, and a solder-dam paste method.

With this arrangement, the precoating method can supply a larger amount of solder in a short time, compared with a plating method. In order to attain finer pitch, the Super Juffit (Registered Trademark) method and the super solder method are particularly suitable.

In the semiconductor device according to the present embodiment, the solder layer may be formed by means of a plating method.

With this arrangement, although it takes time to supply the solder, the amount of solder which can be supplied does not vary by the distance between the metal bumps.

In the semiconductor device according to the present embodiment, it is preferable that the metal layer includes Ni.

With this arrangement, in a case where the solder layer is formed by means of the Super Juffit (Registered Trademark) method, it is possible to provide the Ni layer with adhesion so that solder powder sticks on the Ni layer, by treating the Ni layer with a chemical liquid.

In the semiconductor device according to the present embodiment, it is preferable that the metal layer includes at least one metal selected from the group consisting of Bi, Cd, Ge, Zn, Cr, Ga, and TiW.

With this arrangement, it is possible to prevent dissolution of the bump and thereby to ensure high mounting reliability.

In the semiconductor device according to the present embodiment, it is preferable that the metal bump is an Au bump or a Cu bump.

With this arrangement, it is possible to ensure good electric conductivity.

In the semiconductor device according to the present embodiment, it is preferable that the protruded portion is a projection having a cone-shape.

With this arrangement, because the protruded portion has a sharp-pointed tip, it is possible to mount the semiconductor device on the circuit board more easily.

In the semiconductor device according to the present embodiment, the protruded portion may have a loop-shape.

A method according to the present embodiment for mounting the semiconductor device is a method for mounting the semiconductor device on a circuit board, the method including the steps of: forming a solder layer on an electrode on the circuit board; and causing the solder layer of the semiconductor device and the solder layer thus formed on the electrode on the circuit board to be melted and combined with each other.

A mounting structure according to the present embodiment of the semiconductor device is realized by causing a solder layer of a semiconductor device and a solder layer formed on an electrode on a circuit board to be melted and combined with each other.

With this arrangement, because the solder is supplied, in advance, both on the electrode on the circuit board and on the semiconductor device, it is possible to bond the semiconductor device to the circuit board with a sufficient amount of solder. Also, as described above, the metal bump provided on the semiconductor device has the protruded portion, and the metal layer is formed between the metal bump and the solder layer. This ensures high mounting reliability.

In the method according to the present embodiment for mounting the semiconductor device, the solder layer is formed on the electrode on the circuit board by using (i) any one of all precoating methods including a Super Juffit (Registered Trademark) method, a solder paste method, a super solder method, and a solder-dam paste method or (ii) a plating method.

The present invention is useful for a semiconductor device provided with a metal bump for use in flip-chip bonding.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A semiconductor device, comprising:
   a semiconductor substrate;
   a metal bump provided on an electrode on the semiconductor substrate; and
   a solder layer formed on at least a part of a surface of the metal bump,
   the metal bump having a protruded portion which protrudes toward a surface of the circuit board on which surface the semiconductor device is to be mounted, and
   a metal layer being formed between the metal bump and the solder layer so as to protect the metal bump,
   wherein the metal layer covers at least the protruded portion, and
   wherein when the electrode on which the metal bump is provided has an uncovered part, the metal layer is formed so as to cover the uncovered part of the electrode.

2. The semiconductor device as set forth in claim 1, wherein:
   the metal layer further covers a part of a surface protection film on the semiconductor substrate.

3. The semiconductor device as set forth in claim 1, wherein:
   the metal layer is a sputtered film or a plated film.

4. The semiconductor device as set forth in claim 1, wherein:
   the solder layer is formed so as to cover the protruded portion and a top surface of the metal bump, the top surface facing the circuit board.

5. The semiconductor device as set forth in claim 1, wherein:
   the solder layer is formed by means of any one of all precoating methods including a Super Juffit (Registered Trademark) method, a solder paste method, a super solder method, and a solder-dam paste method.

6. The semiconductor device as set forth in claim 1, wherein:
the solder layer is formed by means of a plating method.

7. The semiconductor device as set forth in claim 3, wherein:
the metal layer includes Ni.

8. The semiconductor device as set forth in claim 3, wherein:
the metal layer includes at least one metal selected from the group consisting of Bi, Cd, Ge, Zn, Cr, Ga, and TiW.

9. The semiconductor device as set forth in claim 1, wherein:
the metal bump is an Au bump or a Cu bump.

10. The semiconductor device as set forth in claim 1, wherein:
the protruded portion is a projection having a cone-shape.

11. The semiconductor device as set forth in claim 1, wherein:
the protruded portion has a loop-shape.

12. A semiconductor device, comprising:
a semiconductor substrate;
a metal bump provided on an electrode on the semiconductor substrate; and
a solder layer formed on at least a part of a surface of the metal bump,
the metal bump having a protruded portion which protrudes toward a surface of a circuit board on which surface the semiconductor device is to be mounted, and
a metal layer being formed between the metal bump and the solder layer so as to protect the metal bump, wherein:
the solder layer is formed so as to cover a whole surface of the metal layer.

13. A method for mounting a semiconductor device on a circuit board, the semiconductor device comprising: a semiconductor substrate; a metal bump provided on an electrode on the semiconductor substrate; and a solder layer formed on at least a part of a surface of the metal bump, the metal bump having a protruded portion which protrudes toward a surface of the circuit board on which surface the semiconductor device is to be mounted, and a metal layer being formed between the metal bump and the solder layer so as to protect the metal bump,
the method comprising the steps of:
forming a solder layer on an electrode on the circuit board; and
causing the solder layer of the semiconductor device and the solder layer thus formed on the electrode on the circuit board to be melted and combined with each other.

14. The method as set forth in claim 13 for mounting the semiconductor device, wherein:
the solder layer is formed on the electrode on the circuit board by using (i) any one of all precoating methods including a Super Juffit (Registered Trademark) method, a solder paste method, a super solder method, and a solder-dam paste method or (ii) a plating method.

15. A mounting structure of a semiconductor device realized by causing a solder layer of a semiconductor device and a solder layer formed on an electrode on a circuit board to be melted and combined with each other, the semiconductor device comprising: a semiconductor substrate; a metal bump provided on an electrode on the semiconductor substrate; and the solder layer formed on at least a part of a surface of the metal bump, the metal bump having a protruded portion which protrudes toward a surface of the circuit board on which surface the semiconductor device is to be mounted, and a metal layer being formed between the metal bump and the solder layer so as to protect the metal bump.

* * * * *